(12) United States Patent
Goto

(10) Patent No.: US 7,709,288 B2
(45) Date of Patent: May 4, 2010

(54) METHOD FOR MANUFACTURING MULTI-JUNCTION SOLAR CELL

(75) Inventor: Hajime Goto, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 352 days.

(21) Appl. No.: 11/826,656

(22) Filed: Jul. 17, 2007

(65) Prior Publication Data
US 2008/0017240 A1    Jan. 24, 2008

(30) Foreign Application Priority Data
Jul. 20, 2006   (JP)   ............................. 2006-198545

(51) Int. Cl.
*H01L 21/00* (2006.01)
*H01L 31/0376* (2006.01)

(52) U.S. Cl. .............................. 438/94; 438/57; 438/62; 438/72; 438/74; 438/96; 257/53; 257/64; 257/E27.124; 257/E27.125; 257/E25.007; 136/206; 136/243; 136/252; 136/255; 136/256

(58) Field of Classification Search ................... 438/57, 438/74, 94, 96; 257/51, 53, E25.007, E27.124, 257/E27.125; 136/206, 243, 249, 255, 256
See application file for complete search history.

(56) References Cited

U.S. PATENT DOCUMENTS 6,815,736 B2 * 11/2004 Mascarenhas ............... 257/201

(Continued)

FOREIGN PATENT DOCUMENTS

JP    9-64386 A    3/1997

OTHER PUBLICATIONS

Geisz et al., National Renewable Energy Laboratory, NREL/CP-520-25631, Dec. 1998, pp. 1-6.

(Continued)

*Primary Examiner*—Dao H Nguyen
(74) *Attorney, Agent, or Firm*—Birch, Stewart, Kolasch & Birch, LLP

(57) ABSTRACT

The present invention provides a method for manufacturing a multi-junction solar cell which makes it possible to implement a 4-junction solar cell and to increase the area of a device. A nucleus generation site is disposed on a substrate 2 made of a first semiconductor. A first material gas is fed to the nucleus generation site to form a wire-like semiconductor 3 in the nucleus generation site. A third material gas and a fourth material gas are fed to form a wire-like semiconductor 4 on the semiconductor 3 and a wire-like semiconductor 5 on the semiconductor 4. A nucleus generation site is disposed on a substrate 6. The first material gas is fed to the nucleus generation site to form a wire-like semiconductor 2a in the nucleus generation site. A second material gas to the fourth material gas are fed to form the wire-like semiconductor 3 on the semiconductor 2a, the wire-like semiconductor 4 on the semiconductor 3, and the wire-like semiconductor 5 on the semiconductor 4. The bandgaps of the semiconductors decrease and increase consistently with the distance to the substrate 2 or 6. The nucleus generation site is made of catalytic particles such as Au. The semiconductors 2 and 2a are Ge, the semiconductor 3 is $In_xGa_{1-x}As$, the semiconductor 4 is GaAs, and the semiconductor 5 is $Al_yGa_{1-y}As$.

9 Claims, 2 Drawing Sheets

U.S. PATENT DOCUMENTS

| | | | |
|---|---|---|---|
| 7,615,400 B2* | 11/2009 | Goto et al. | 438/94 |
| 2005/0009224 A1* | 1/2005 | Yang et al. | 438/57 |
| 2006/0207647 A1* | 9/2006 | Tsakalakos et al. | 136/256 |
| 2009/0267066 A1* | 10/2009 | Yamazaki et al. | 257/51 |

OTHER PUBLICATIONS

Okada et al., Proceedings of the 3rd World Conference on Photovoltaic Energy Conversion (WCPEC-3), Osaka (May 2003).

* cited by examiner

METHOD FOR MANUFACTURING MULTI-JUNCTION SOLAR CELL

BACKGROUND OF THE INVENTION

1. Field of the Invention

The present invention relates to methods for manufacturing multi-junction solar cells.

2. Description of the Related Art

Single-junction solar cells each comprising a single pn junction have been known. However, the generation efficiency of the single-junction solar cell has a theoretical limit determined by the bandgap Eg of a semiconductor material used as a raw material. It is thus known that regardless of whatever semiconductor material is used, the generation efficiency achieved under ground-based solar irradiation conditions is limited to about 30%.

Thus, to offer generation efficiency higher than that of the single-junction solar cell, proposal has been made of a multi-junction solar cell formed by stacking a plurality of solar cells each having a pn junction. The most simple known multi-junction solar cell is a 2-junction solar cell 11 shown in FIG. 3 (see, for example, Japanese Patent Laid-Open No. 9-64386).

The 2-junction solar cell 11 has a bottom cell 13 and a top cell 14 stacked on a back electrode 12 in this order by means of epitaxial growth. A surface electrode 15 is stacked on the top cell 14. In the 2-junction solar cell 11, the bottom cell 13 comprises a GaAs pn junction, whereas the top cell 14 comprises an InGaP pn junction.

The multi-junction solar cell is known to be based on the principle that the available area of a solar spectrum is increased by joining semiconductors with different bandgaps and to be more efficient with more junctions. For example, 4-junction solar cells have been simulated and high efficiency solar cells are expected.

A combination of semiconductors with different bandgaps normally has different lattice constants. Thus, joining semiconductors with significantly different lattice constants may disadvantageously result in a defect in the junction interface between the semiconductors, preventing an increase in efficiency. This problem is due to the fact that a large number of dangling bonds present in the defect urge excitations excited by solar light to be recombined, thereby power cannot be taken out.

As a result, the combination of semiconductors constituting the multi-junction solar cell is limited to the combination of materials having different bandgaps but similar lattice constants (what is called a well lattice matched combination). When taking further into account the matching with the solar spectrum, possible combinations of semiconductors include a combination of InGaP, GaAs, and Ge, a combination of InGaP, InGaAs, and Ge, and the like. Consequently, the multi-junction solar cell is limited to a 3-junction type.

Among these semiconductors, GaInNAs has been gathering much attention as a material having a bandgap of about 1 eV while maintaining lattice matching with Ge and GaAs. Continuous studies have thus been conducted on a 4-junction solar cell comprising a combination of InGaP, InGaAs, GaInNAs, and Ge (see, for example, J. F. Geisz, D. J. Friedman, C. Kramer, A. Kibbler, and S. R. Kurtz, "New Materials for Future Generations of III-V Solar Cells", NREL/CP-520-25631, National Renewable Energy Laboratory, December 1998).

However, GaInNAs may cause phase separation or other defects. Thus, with GaInNAs, there is a disadvantage that it is difficult to grow crystals in implementing a 4-junction solar cell.

Further, the performance of the 3-junction solar cell has been evaluated with a device with an area of at most 4 cm$^2$. It is known that the efficiency of the 3-junction solar cell decreases with increasing area of the device (see Akira Ohmae, Yukiko Shimizu, and Yoshitake Okada, "GaInNAs for Multi-Junction Tandem Solar Cells", Photovoltaic Energy Conversion, 2003. Proceedings of 3rd World conference on Volume 2, 12-16 May 2003). The reduced efficiency is expected to result from a possible defect in the vicinity of the junction interface caused by the different lattice constants of the semiconductors regardless of whether the solar cell is of the 2- or 3-junction type.

Therefore, the multi-junction solar cell has the disadvantage of making an increase in the area of the device difficult.

SUMMARY OF THE INVENTION

An object of the present invention is to provide a method for manufacturing a multi-junction solar cell which can avoid the above disadvantages to enable the implementation of a 4-junction solar cell and an increase in the area of a device.

To accomplish the object, a first aspect of a method for manufacturing a multi-junction solar cell in accordance with the present invention comprises a step of disposing a nucleus generation site on a substrate comprising a first semiconductor forming a first single-junction solar cell, and a step of feeding a first material gas to the nucleus generation site to grow a second semiconductor into a wire-like second single-junction solar cell comprising the second semiconductor in the nuclear generation site.

According to the first aspect of the manufacturing method in accordance with the present invention, the nucleus generation site is disposed first on the substrate. The first material gas is then fed to the nucleus generation site. This grows the first semiconductor into a wire shape using the nucleus generation site as a nucleus. A second single-junction solar cell comprising the first semiconductor is thus formed. The feeding of the first material gas and the growth of the first semiconductor can be carried out by using, for example, an organometallic vapor phase growth apparatus (hereinafter referred to as a MOVPE apparatus).

As a result, the first aspect of the manufacturing method in accordance with the present invention can epitaxially grow the wire-like second semiconductor on the substrate comprising the first semiconductor. This makes it possible to form a multi-junction solar cell comprising the first single-junction solar cell comprising the first semiconductor and the second single-junction solar cell comprising the second semiconductor.

The first aspect of the manufacturing method in accordance with the present invention preferably further comprises a step of, after the wire-like second semiconductor grows to a predetermined length, feeding a second material gas to grow a third semiconductor into a wire-like third single-junction solar cell comprising the third semiconductor on the second single-junction solar cell and a step of feeding a third material gas to grow a fourth semiconductor into a wire-like fourth single-junction solar cell comprising the fourth semiconductor on the third single-junction solar cell.

Thus, as is the case with the step of feeding the first material gas to grow the second semiconductor into the wire-like second single-junction solar cell comprising the second semiconductor, the third semiconductor can be grown into the wire-like third single-junction solar cell comprising the third semiconductor on the second single-junction solar cell. Likewise, the fourth semiconductor can be grown into the wire-like fourth single-junction solar cell comprising the fourth semiconductor on the third single-junction solar cell.

As a result, the first aspect of the manufacturing method in accordance with the present invention can epitaxially grow the wire-like second to fourth semiconductors on the substrate comprising the first semiconductor. This makes it possible to form a 4-junction solar cell comprising the sequentially joined first to fourth single-junction solar cells.

A second aspect of a method for manufacturing a multi-junction solar cell in accordance with the present invention comprises a step of disposing a nucleus generation site on a substrate, a step of feeding a first material gas to the nucleus generation site to grow a first semiconductor into a wire-like first single-junction solar cell comprising the first semiconductor, and a step of feeding a second material gas to the nucleus generation site to grow a second semiconductor into a wire-like second single-junction solar cell comprising the second semiconductor on the first single-junction solar cell.

According to the second aspect of the manufacturing method in accordance with the present invention, the nucleus generation site is disposed first on the substrate. The first material gas is then fed to the nucleus generation site. The substrate may be composed of any material provided that the material can be commonly used to manufacture solar cells. The substrate may or may not be a semiconductor. This grows the first semiconductor into a wire shape using the nucleus generation site as a nucleus. A first single-junction solar cell comprising the first semiconductor is thus formed. The feeding of the first material gas and the growth of the first semiconductor can be carried out by using the MOVPE apparatus as in the case of the first embodiment.

Once the wire-like first semiconductor grows to a predetermined length, the second material gas is fed. Thus, as is the case with the step of feeding the first material gas to grow the first semiconductor into the first single-junction solar cell comprising the first semiconductor, the second semiconductor can be grown into the wire-like second single-junction solar cell comprising the second semiconductor on the first single-junction solar cell.

As a result, the second aspect of the manufacturing method in accordance with the present invention can epitaxially grow the wire-like first and second semiconductors on the substrate. This makes it possible to form a multi-junction solar cell comprising the first single-junction solar cell comprising the first semiconductor and the second single-junction solar cell comprising the second semiconductor.

The second aspect of the manufacturing method in accordance with the present invention preferably further comprises a step of, after the wire-like second semiconductor grows to a predetermined length, feeding a third material gas to grow a wire-like third single-junction solar cell comprising a third semiconductor on the second single-junction solar cell and a step of feeding a fourth material gas to grow a fourth semiconductor into a wire-like fourth single-junction solar cell comprising the fourth semiconductor on the third single-junction solar cell.

Thus, as is the case with the step of feeding the second material gas to grow the second semiconductor into the wire-like second single-junction solar cell comprising the second semiconductor, the third semiconductor can be grown into the wire-like third single-junction solar cell comprising the third semiconductor on the second single-junction solar cell. Likewise, the fourth semiconductor can be grown into the wire-like fourth single-junction solar cell comprising the fourth semiconductor on the third single-junction solar cell.

As a result, the second aspect of the manufacturing method in accordance with the present invention can epitaxially grow the wire-like first to fourth semiconductors on the substrate. This makes it possible to form a 4-junction solar cell comprising the sequentially joined first to fourth single-junction solar cells on the substrate.

When the 4-junction solar cell is formed as described above, the multi-junction structure of different semiconductors is formed of the wire-like first to fourth semiconductors. As a result, the junction interface between the wire-like semiconductors has a very small area, reducing strain resulting from a difference in lattice constant. Occurrence of defects can thus be prevented. This in turn alleviates the limitation of the selection of materials attributed to the difference in lattice constant. The number of options for a combination of materials can thus be increased.

Since the aspects of the manufacturing method in accordance with the present invention can epitaxially grow the wire-like semiconductors on the substrate, the multi-junction solar cell obtained is itself shaped like a wire. Consequently, the junction interface is small and does not undergo any defect. A device with a large area can thus be obtained by forming an indefinite number of the wire-like multi-junction solar cells on the substrate.

According to the aspects of the manufacturing method in accordance with the present invention, the semiconductors are preferably disposed so that a bandgap in the second semiconductor is larger than a bandgap in the first semiconductor, a bandgap in the third semiconductor is larger than the bandgap in the second semiconductor, and a bandgap in the fourth semiconductor is larger than the bandgap in the third semiconductor.

According to the aspects of the manufacturing method in accordance with the present invention, the nucleus generation site preferably comprises catalytic particles. Since the nucleus generation site comprises the catalytic particles, the semiconductors can be easily grown into a wire shape using the catalytic particles as a nucleus. The catalytic particles may comprise, for example, Au.

According to the aspects of the manufacturing method in accordance with the present invention, preferably, the first semiconductor is Ge, the second semiconductor is $In_xGa_{1-x}As$, the third semiconductor is GaAs, and the fourth semiconductor is $Al_yGa_{1-y}As$. Here, x is $1>x>0$, and y is $1>y>0$. The first to fourth semiconductors are composed of these materials and can thus be epitaxially grown without causing any defect at the junction interface between the semiconductors.

DETAILED DESCRIPTION OF THE PREFERRED EMBODIMENTS

Figure 1:
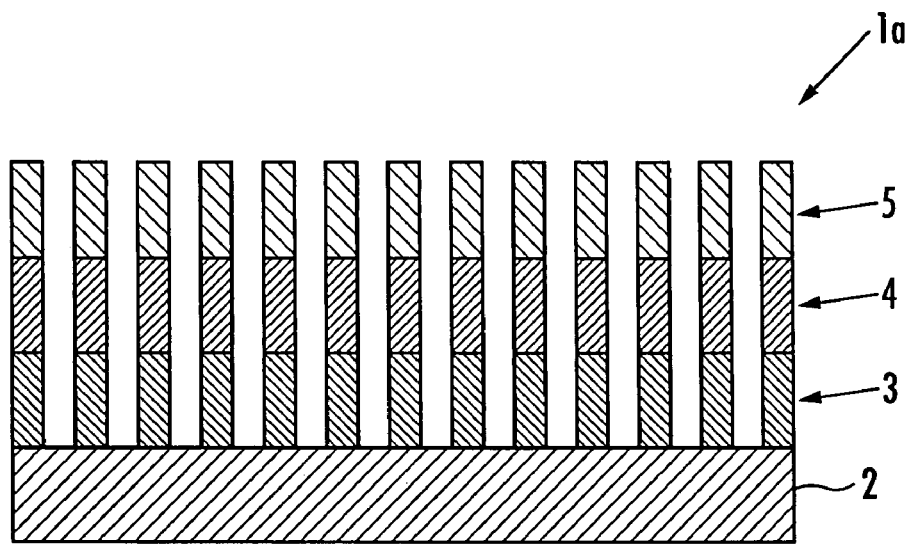
FIG. 1 is a sectional view illustrating an example of the configuration of a multi-junction solar cell obtained by a manufacturing method in accordance with the present invention.

As shown in FIG. 1, a multi-junction solar cell 1a obtained according to a first aspect of a manufacturing method in accordance with the present embodiment comprises a substrate 2 comprising a first semiconductor, a second semiconductor 3 grown into a wire shape on the substrate 2, a third conductor 4 connected to an end of the second semiconductor 3 located away from the substrate 2 and grown into a wire shape, and a fourth semiconductor 5 connected to an end of the third semiconductor 4 located away from the substrate 2 and grown into a wire shape. In the multi-junction solar cell 1a, the semiconductor 1 forms a first solar cell, the semiconductor 2 forms a second solar cell, the semiconductor 3 forms a third solar cell, and the semiconductor 4 forms a fourth solar cell. The multi-junction solar cell 1a forms a 4-junction solar cell.

In the multi-junction solar cell 1a, for example, the first semiconductor, forming the substrate 2, may be made of Ge (111). The second semiconductor 3 may be made of $In_{0.34}Ga_{0.67}As$. The third semiconductor 4 may be made of GaAs. The fourth semiconductor 5 may be made of $Al_{0.25}Ga_{0.75}As$. The substrate 2 is, for example, a 2-inch Ge (111) crystal. The semiconductors 3, 4, and 5 have a length of, for example, 1 μm respectively.

The multi-junction solar cell 1a, shown in FIG. 1, can be manufactured, for example, as described as follows.

In a first step, catalytic particles constituting a nucleus generation site are disposed on the substrate 2, made of Ge (111). The catalytic particles may be, for example, Au particles having an average grain size of 20 nm.

To dispose the Au particles on the substrate 2, preparation is made of an Au colloid of average grain size 20 nm using chloroform as a solvent and octadecanthiol as a protective agent and an Ag colloid of average grain size 12 nm using chloroform as a solvent and oleic acid as a protective agent. Both colloids are then mixed together so that the ratio of the number of Au particles to the number of Ag grains is 1:2 to form a mixed colloid.

The mixed colloid is then dropped onto a pure water surface in a trough in an LB (Langmuir-Blodgett) film manufacturing apparatus. With a surface pressure-occupation area (π-A) curve measured, the colloid is compressed until surface pressure reaches 10 mN to form an LB film.

The LB film is then transferred to the substrate 2. The substrate 2 has been treated in a 10 wt % water solution of HF to remove a natural oxide film from the surface of the substrate 2.

The substrate 2 with the LB film transferred thereto is immersed in a 1 wt % water solution of nitric acid to dissolve and remove the Ag grains. This maintains the appropriate distance between the Au particles to prevent the Au particles from being combined together even under heat.

The substrate 2 with the Ag grains removed therefrom is heated in a vacuum to 540° C. to remove the remaining organic components. The substrate is then cooled to room temperature. As a result, Au particles of average grain size 20 nm are uniformly disposed on the substrate 2.

In a second step of the manufacture of the multi-junction solar cell 1a, the second semiconductor 3, made of $In_{0.34}Ga_{0.67}As$, is grown on the substrate 2, made of Ge (111) and having the Au particles disposed thereon.

To grow the second semiconductor 3, first, the substrate 2 with the Au particles disposed thereon is installed in a reaction chamber of the organometallic vapor phase growth apparatus (MOVPE apparatus) and the interior of the MOVPE apparatus is purged with a $H_2$ gas.

The temperature of the substrate 2 then is increased until it reaches 480° C. under the effect of $H_2$ gas stream. When the temperature of the substrate 2 reaches 480° C., a first material gas is fed to the reaction chamber using the $H_2$ gas as a carrier gas.

The first material gas is a mixed gas of trimethylindium (hereinafter simply referred to as TMI), trimethylgallium (hereinafter simply referred to as TMG), and $AsH_3$. The mixed gas has a molar ratio of TMI to TMG, TMI:TMG=1:2 and is set so that the molar ratio of the total of TMI and TMG to $AsH_3$, (TMI+TMG):$AsH_3$=1:150. As a result, the Au particles disposed on the substrate 2 act as a catalyst to become a nuclear generation site. The second semiconductor 3, made of $In_{0.34}Ga_{0.67}As$, is grown into a wire shape at the position where the Au particles are disposed.

In a third step of the manufacture of the multi-junction solar cell 1a, the third semiconductor 4, made of GaAs, is grown at an end of the second semiconductor 3 grown into a wire shape on the substrate 2 which end is located away from the substrate 2.

To grow the third semiconductor 4, the gas fed to the reaction chamber using the $H_2$ gas as a carrier gas is switched from the first material gas to the second material gas when the second semiconductor 3 has grown to a predetermined length, for example, 1 μm. An interruption time required for the switching is set at, for example, 10 seconds.

The second material gas is a mixed gas of TMG and $AsH_3$. The mixed gas is set so that, for example, the molar ratio of TMI to $AsH_3$, TMG:$AsH_3$=1:95. As a result, the third semiconductor 4, made of GaAs, is grown at an end of the second semiconductor 3 which is located away from the substrate 2.

In a fourth step of the manufacture of the multi-junction solar cell 1a, the fourth semiconductor 5, made of $Al_{0.25}Ga_{0.75}As$, is grown at an end of the third semiconductor 4 grown into a wire shape which end is located away from the substrate 2.

To grow the fourth semiconductor 5, the gas fed to the reaction chamber using the $H_2$ gas as a carrier gas is switched from the second material gas to the third material gas when the third semiconductor 4 has grown to a predetermined length, for example, 1 μm. The interruption time required for the switching is set at, for example, 10 seconds.

The third material gas is a mixed gas of trimethylaluminum (hereinafter simply referred to as TMA), TMG, and $AsH_3$. The mixed gas is set so that, for example, the molar ratio of TMA to TMG, TMA:TMG=3:7 and so that the molar ratio of the total of TMA and TMG to $AsH_3$, (TMA+TMG):$AsH_3$=1:200. As a result, the fourth semiconductor 5, made of $Al_{0.25}Ga_{0.75}As$, is grown at an end of the third semiconductor 4 which is located away from the substrate 2.

Then, when the fourth semiconductor 5 grows to a predetermined length, for example, 1 μm, the gas fed to the reaction chamber is switched from the third material gas to an $H_2$ gas mixed with 20 vol % of $AsH_3$ to stop growing the fourth semiconductor 5. The substrate is then cooled under the $H_2$ gas system mixed with 20 vol % of $AsH_3$. The obtained multi-junction solar cell 1a is then taken out.

Table 1 shows the bandgaps and lattice constants of the semiconductors constituting the multi-junction solar cell 1a.

TABLE 1

|  | Bandgap (eV) | Lattice constant (A) |
|---|---|---|
| Ge (111) | 0.7 | 5.658 |
| $In_{0.34}Ga_{0.67}As$ | 1.0 | 5.778 |
| GaAs | 1.4 | 5.653 |
| $Al_{0.25}Ga_{0.75}As$ | 1.8 | 5.655 |

Table 1 clearly indicates that the semiconductors 1 to 4 are disposed on the multi-junction solar cell 1a obtained according to the first aspect of the manufacturing method in accordance with the present embodiment so that the bandgap thereof decreases as the distance to the substrate 2 decreases, and increases as the distance to the substrate 2 increases, including the substrate 2 per se made of Ge (111).

In the multi-junction solar cell 1a, each of the semiconductors 1, 3, and 4 has a lattice constant of about 5.655A, indicating appropriate lattice matching. However, only the second semiconductor 3, made of $In_{0.34}Ga_{0.67}As$, has a lattice constant of 5.778A. As a result, about 2.3% of lattice mismatch occurs at the junction interface between the substrate 2, made of Ge (111) and the second semiconductor 3 and at the junction interface between the second semiconductor 3 and the third semiconductor 4.

Then, the junction interfaces of the semiconductors 1, 2, 3, and 4 were observed with a high-performance electron microscope to examine whether there are defects at the junction interfaces or not.

Before conducting the examination, a silicon oxide film was deposited on the substrate 2 by plasma chemical vapor phase growth. The semiconductors 3, 4, and 5 each grown into a wire shape were buried in the silicon oxide film for protection. The substrate 2 was then cut off using focused ion beams. The semiconductors 3, 4, and 5 each grown into a wire shape were ultrasonically dispersed in ethanol to obtain a suspension. The suspension was dropped onto a grid of a transmissive electron microscope and then dried for observation with the high performance transmissive electron microscope.

The observation with the high-performance transmissive electron microscope showed that most of the semiconductors 3, 4, and 5 each grown into a wire shape had a diameter of 20 nm, which is equal to the average grain diameter of the Au particles, whereas some of the semiconductors had a diameter of about 50 nm. The latter semiconductors are considered to have undergone the aggregation of the Au particles during growth. The semiconductors 3, 4, and 5 each grown into a wire shape did not exhibit any defect at the junction interface (hetero junction interface) between the different semiconductors regardless of the diameter.

Consequently, the multi-junction solar cell 1a as a 4-junction solar cell prevents carriers generated by incident light from being recombined at the hetero junction interface, enabling an increase in efficiency.

The extent of alleviation in strain at the hetero junction interface between the substrate 2 and the wire-like semiconductor 3 is smaller than that at the hetero junction interface between the wire-like semiconductors 3 and 4 and 5. Thus, according to the first aspect of the manufacturing method in accordance with the present embodiment, defects may occur at the hetero junction interface between the substrate 2 and the wire-like semiconductor 3.

Figure 2:
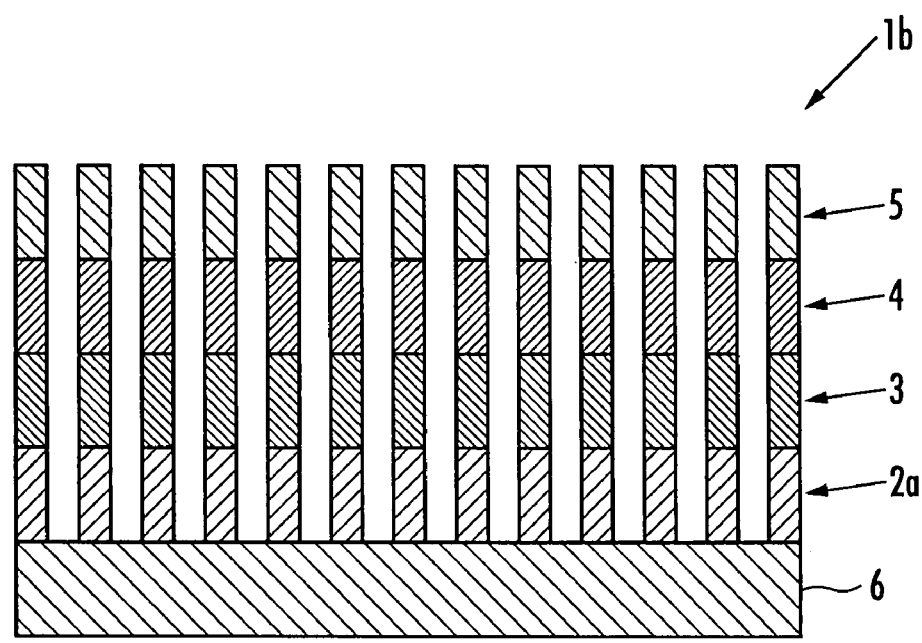
FIG. 2 is a sectional view illustrating an example of another configuration of the multi-junction solar cell obtained by the manufacturing method in accordance with the present invention.
Figure 3:
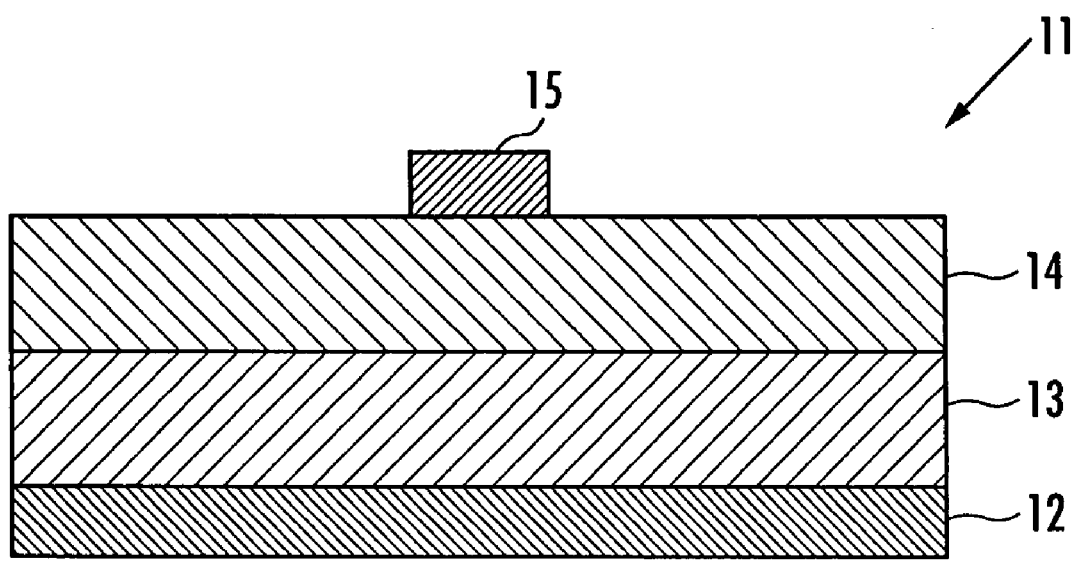
FIG. 3 is a sectional view illustrating an example of the configuration of a conventional multi-junction solar cell.

As shown in FIG. 2, a multi-junction solar cell 1b obtained according to a second aspect of the manufacturing method in accordance with the present embodiment comprises a semiconductor substrate 6, a first semiconductor 2a grown into a wire shape on the substrate 6, the second semiconductor 3 connected to an end of the first semiconductor 2a located away from the substrate 6 and grown into a wire shape, the third semiconductor 4 connected to an end of the second semiconductor 3 located away from the substrate 6 and grown into a wire shape, and the fourth semiconductor 5 connected to an end of the third semiconductor 4 located away from the substrate 6 and grown into a wire shape. In the multi-junction solar cell 1b, the semiconductor 1 forms a first solar cell, the semiconductor 2 forms a second solar cell, the semiconductor 3 forms a third solar cell, and the semiconductor 4 forms a fourth solar cell. The multi-junction solar cell 1b forms a 4-junction solar cell.

In the multi-junction solar cell 1b, the substrate 6 is a semiconductor and is made of, for example, Ge. In this case, the first semiconductor 2a is made of Ge, the same kind of material as that of the substrate 6. The first semiconductor 2a is grown into a wire shape, and the second semiconductor 3, the third semiconductor 4, and the fourth semiconductor 5 are then sequentially grown into a wire shape. This makes it possible to suppress possible defects at the hetero junction interface between the substrate 6 and the wire-like semiconductor 2a.

The second semiconductor 3 may be made of $In_{0.34}Ga_{0.67}As$. The third semiconductor 4 may be made of GaAs. The fourth semiconductor 5 may be made of $Al_{0.25}Ga_{0.75}As$. The substrate 6 is, for example, 2 inches in length, and the semiconductors 2a, 3, 4, and 5 have a length of 1 µm.

Using the method for manufacturing the multi-junction solar cell 1a, the multi-junction solar cell 1b may be manufactured in the exactly same manner as that for the multi-junction solar cell 1a except that after trimethylgermanium (TMGe) is used as the first material gas to grow the first semiconductor 2a comprising Ga on the substrate 6, the second material gas, the third material gas, and the fourth material gas are sequentially switched. The second material gas in the manufacture of the multi-junction solar cell 1b may be the first material gas for the manufacture of the multi-junction solar cell 1a. The third material gas for the manufacture of the multi-junction solar cell 1b may be the second material gas for the manufacture of the multi-junction solar cell 1a. The fourth material gas for the manufacture of the multi-junction solar cell 1b may be the third material gas for the manufacture of the multi-junction solar cell 1a.

In the description of the present embodiment, the semiconductor comprising Ge or the like is used as the substrate 6. However, the substrate 6 is not limited to the semiconductor but may be made of any material provided that the material can be commonly used to manufacture solar cells.

What is claimed is:

1. A method for manufacturing a multi-junction solar cell, the method comprising the steps of:
   disposing a nucleus generation site on a substrate comprising a first semiconductor forming a first single-junction solar cell; and
   feeding a first material gas to the nucleus generation site to grow a second semiconductor into a wire-like second single-junction solar cell comprising the second semiconductor in the nuclear generation site.

2. The method for manufacturing the multi-junction solar cell according to claim 1, wherein the first material gas is a mixed gas of trimethylindium, trimethylgallium, and $AsH_3$.

3. The method for manufacturing the multi-junction solar cell according to claim 1, wherein the first semiconductor is Ge and the second semiconductor is $In_xGa_{1-x}As$.

4. The method for manufacturing the multi-junction solar cell according to claim 1, further comprising the steps of:
- feeding a second material gas to grow a third semiconductor into a wire-like third single-junction solar cell comprising the third semiconductor on the second single-junction solar cell; and
- feeding a third material gas to grow a fourth semiconductor into a wire-like fourth single-junction solar cell comprising the fourth semiconductor on the third single-junction solar cell.

5. The method for manufacturing the multi-junction solar cell according to claim 4, wherein the second material gas is a mixed gas of trimethylgallium and $AsH_3$ and the third material gas is a mixed gas of trimethylaluminum, trimethylgallium, and $AsH_3$.

6. The method for manufacturing the multi-junction solar cell according to claim 4, wherein the third semiconductor is GaAs and the fourth semiconductor is $Al_yGa_{1-y}As$.

7. The method for manufacturing the multi-junction solar cell according to claim 4, wherein the semiconductors are disposed so that a bandgap in the second semiconductor is larger than a bandgap in the first semiconductor, a bandgap in the third semiconductor is larger than the bandgap in the second semiconductor, and a bandgap in the fourth semiconductor is larger than the bandgap in the third semiconductor.

8. The method for manufacturing the multi-junction solar cell according to claim 1, wherein the nucleus generation site comprises catalytic particles.

9. The method for manufacturing the multi-junction solar cell according to claim 8, wherein the catalytic particles comprise Au.

* * * * *